United States Patent [19]

Aigo

[11] Patent Number: 4,519,846
[45] Date of Patent: May 28, 1985

[54] PROCESS FOR WASHING AND DRYING A SEMICONDUCTOR ELEMENT

[76] Inventor: Seiichiro Aigo, 3-15-13, Negishi, Daito-ku, Tokyo, Japan

[21] Appl. No.: 587,580

[22] Filed: Mar. 8, 1984

[51] Int. Cl.[3] ............................................... B08B 3/02
[52] U.S. Cl. ...................................... 134/15; 134/30; 134/33; 134/34; 134/199
[58] Field of Search ................... 134/25.4, 30, 33, 34, 134/199, 15, 64 R, 122 R

[56] References Cited

U.S. PATENT DOCUMENTS

| | | | |
|---|---|---|---|
| T946,003 | 5/1976 | Fontanarosa et al. | 134/25.4 X |
| 3,123,084 | 3/1964 | Tardoskegyi | 134/122 R X |
| 3,489,608 | 1/1970 | Jacobs et al. | 134/25.4 |
| 3,871,914 | 3/1975 | Goffredo et al. | 134/199 X |
| 3,928,064 | 12/1975 | Holm | 134/25.4 X |
| 4,027,686 | 6/1977 | Shortes et al. | 134/30 X |
| 4,092,176 | 5/1978 | Kozai et al. | 134/199 X |
| 4,178,188 | 12/1979 | Dussault et al. | 134/34 X |
| 4,361,163 | 11/1982 | Aigo | 134/199 |
| 4,458,703 | 7/1984 | Inoue et al. | 134/64 R X |
| 4,479,849 | 10/1984 | Frantzen | 134/15 X |

OTHER PUBLICATIONS

*Western Electric*, Tech. Dig. No. 29, Lecatsas et al., "Laminar Flow Cleaning", Jan. 1973, pp. 39–40.

*Primary Examiner*—Marc L. Caroff
*Attorney, Agent, or Firm*—Cantor and Lessler

[57] ABSTRACT

After subjecting a semiconductor element to etching, it must be washed with water and then dried so as to remove any etchant therefrom. In the course of the washing and drying steps, the semiconductor element may undergo quality changes due to its contact with water. Such quality changes become remarkable when the semiconductor element is kept for a long time period in the resultant washings. The above quality changes can be successfully avoided by holding an etched semiconductor element horizontally over a water-washing tank, pre-washing its downwardly-directed front surface with an upward jet of water, thoroughly washing the front surface with pure water blown upwardly from a lower part of the tank while washing its upwardly-directed rear surface with water so that both surfaces of the semiconductor element are washed completely, and then immediately spin-drying the thus-washed semiconductor element.

6 Claims, 7 Drawing Figures

PROCESS FOR WASHING AND DRYING A SEMICONDUCTOR ELEMENT

BACKGROUND OF THE INVENTION

1. Field of the Invention

This invention relates to a process for water-washing and drying a semiconductor element whose one side has been subjected to etching, such as a silicon wafer or glass photomask.

2. Description of the Prior Art

When forming a semiconductor-wiring circuit on one surface of a semiconductor element having a thin plate-like shape, a thin metal film or oxide film is applied on the surface of the semiconductor element and a photoresist is coated as a thin film on desired areas of the surface of the element. The photoresist is exposed and then developed to form a pattern which will serve as the wiring circuit. Then, the thus-developed semiconductor element is subjected to etching so as to remove thin metal films at areas other than those where the pattern has been formed. Thereafter, the photoresist is peeled off to give the semiconductor-wiring circuit.

According to the prior art technique, an etched semiconductor element is moved into a water-washing tank by means of a chuck head, where only one surface in which a circuit is to be formed is washed with water. Then, it is placed in a carrier held in a water tank which is generally called a "pool". After the carrier has been filled with a prescribed number of wafers, generally, with 25-50 sheets of wafers, the wafers are transferred still in the carrier to the next drying step. Therefore, semiconductor elements which were placed earlier in the carrier are kept for longer periods of time in the water of the pool. When 25 sheets of semiconductor elements are held in the carrier for example, the semiconductor element which is first placed in the carrier will remain for 72 minutes in the water if each sheet of semiconductor elements takes 3 minutes for its processing. Since a small amount of an etchant is still present on each semiconductor element when it is placed in the pool, the etchant is added to the water in the pool. Ions are formed from the thus-added etchant, thereby subjecting the surface of each semiconductor element to a further reaction. Thus, the prior art process is accompanied by a drawback that the surface of each semiconductor element is changed when it is immersed for a long period of time in water.

SUMMARY OF THE INVENTION

An object of this invention is to solve the above-described drawbacks of the prior art techniques and to provide a washing and drying process of semiconductor elements, which process permits to remove an etchant run even onto the rear surface of a semiconductor element and to dry the semiconductor element immediately after its washing without need for immersing same in a pool.

In one aspect of this invention, there is thus provided a process for washing and drying a semiconductor element whose one side has been subjected to etching, which process comprises:

(a) holding the semiconductor element horizontally with the etched surface directed upwards over a cup-like water-washing tank and pre-washing the etched surface of the semiconductor element with water jetted out from water nozzles provided in the tank;

(b) washing the etched surface with pure water blown upwardly from a lower part of the tank;

(c) in the course of washing the etched surface with pure water, washing the rear surface of the semiconductor element, which rear surface has been kept as the upper surface of the semiconductor element in the steps (a) and (b), by causing water to fall onto the rear surface; and then (d) spinning the semiconductor element to spin-dry the same.

In the washing and drying process of this invention, both front and rear surfaces of each semiconductor element are suitably washed with water. Therefore, the etchant can be removed completely. The thus-washed element is immediately dried without immersing it in water. Accordingly, the semiconductor element is kept free from changes which would otherwise occur due to a reaction with the remaining etchant and/or due to its immersion in water, leading to an improvement to the quality of the semiconductor element.

The above and other objects, features and advantages of this invention will become apparent from the following description and the appended claims, taken in conjunction with the accompanying drawings.

DETAILED DESCRIPTION OF THE INVENTION AND PREFERRED EMBODIMENTS

The invention will be described in further detail with reference to the accompanying drawings.

Figure 1:
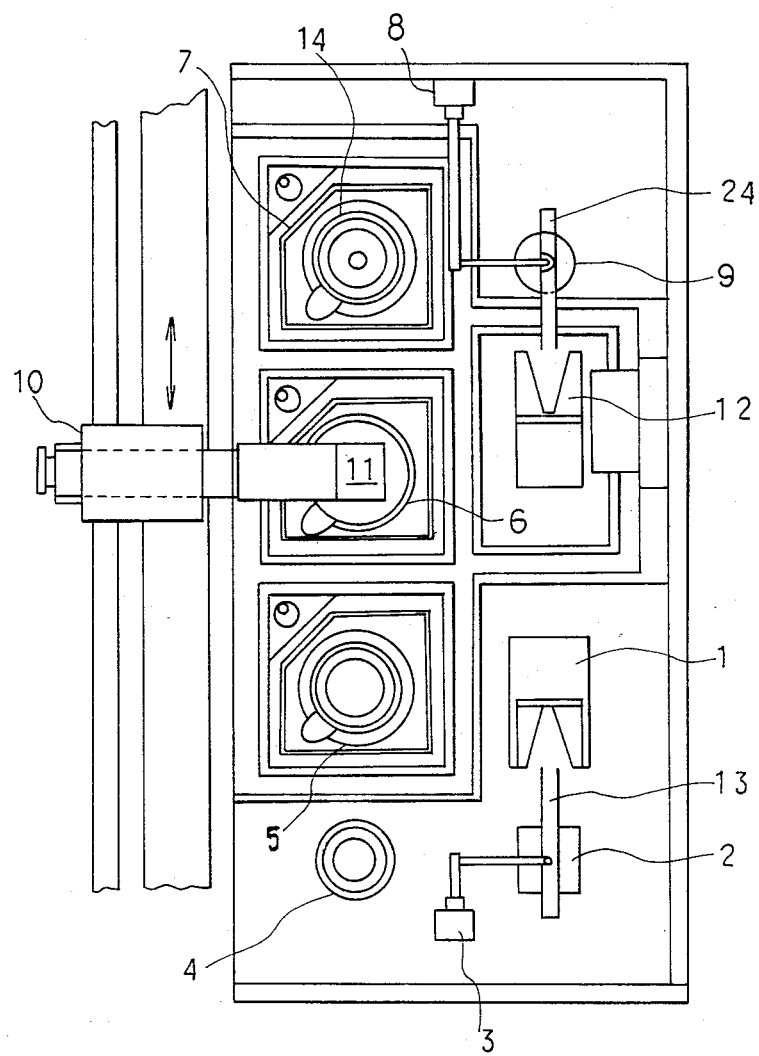
FIG. 1 is plan view of a system which includes some units adapted to practice the process of this invention.

FIG. 1 shows one example of a system adapted to conduct an etching process which includes a step for practicing the washing and drying process of this invention. In FIG. 1, numeral 1 indicates a first carrier adapted to hold a prescribed number of semiconductor elements, namely silicon wafers S in the illustrated embodiment. In FIG. 1, there are also illustrated a first stage 2, a wafer-inverting machine 3, a second stage 4, a pre-etching water-washing unit 5, an etching unit 6, a water-washing unit adapted to practice a part of the process of this invention, an inverting machine 8, a spinning machine 9, and a conveyor 10 for carrying wafers one after another. The conveyor 10 has a chuck head 11 equipped with a vacuum-sucking disk.

In the above system, the wafers held in the first carrier 1 are mounted one by one, successively, with their front surfaces directed upwards on the first stage 2 by means of a suitable feeder 13. The wafers are then inverted by means of the inverting machine 3 equipped with a sucking disk at the free end thereof and are thereafter mounted on the second stage 4 with their front surfaces directed downwards. The wafers are carried from the stage 4 to the water-washing unit 5 by means of the conveyor 10, where their pre-washing steps are carried out with water prior to their etching steps. Thereafter, each wafer is moved to a position above the etching unit 6 by means of the conveyor 10 while keeping its front surface, in which a wiring circuit is to be formed, directed downwards. At the etching unit 6, the front surface of the wafer is etched with an etchant blown upwardly.

Figure 2:
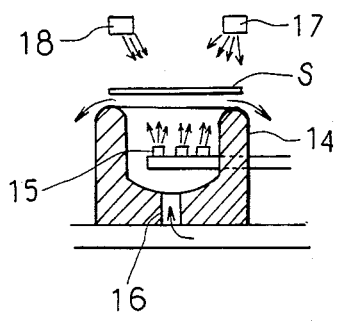
FIG. 2 is a schematic view of a unit useful in the practice of the water-washing step of the present invention, a part of which unit is shown in cross-section.

This invention relates to the washing and drying steps which are to be conducted after completion of etching. Up to the drying of the rear surface which assumes the upper side of the wafer, all procedures are carried out at the water-washing unit 7 which follows the etching unit 6. Namely, after the downwardly-directed surface of the wafer has been etched, the wafer is held in a sucked state by means of the chuck head 11 of the conveyor 10 with its front surface still directed downwards in the embodiment illustrated in FIG. 1. The wafer is then moved in the above position to the water-washing unit 7, where the wafer is held horizontally over a cup-like water-washing tank 14 as illustrated in FIG. 2. When the wafer has reached a prescribed position, pure water is first of all jetted against the downwardly-directed front surface of the wafer from water nozzles 15 provided at suitable locations in the tank 14 so that the front surface is pre-washed with water. This water-washing is conducted by a water jet. Thus, the water-washing is carried out promptly and the etchant is removed promptly. The etchant can thus be removed completely from the front surface of the wafer and the front surface is, at the same time, prevented from allowing a stain film to occur there.

Thereafter, pure water is blown upwards through a passage 16 formed in a bottom part of the tank 14, whereby to wash the front surface of the wafer thoroughly. After this thorough washing of the front surface has started, the suction of the chuck head 11 is released and the conveyor 10 returns to a position above the second stage 4 so as to carry away the next wafer from the second stage in the same manner. In the through washing of the front surface, the wafer is kept in a state floated on the water-washing tank 14 by the upwardly-blown water. This thorough washing is carried out generally for 2-3 minutes, while the rear surface of the wafer which is floating over the tank 14 with the rear surface directed upwards is preferably washed with a shower of water by means of shower means 17. This washing by the shower of water is conducted to wash away the etchant run onto the rear surface of the wafer or reaction gases formed in the preceding etching step and may hence be completed in a shorter period of time compared with the thorough washing. Immediately after the washing by the shower of water, gas is blown against the rear surface of the wafer from a gas nozzle 18 so as to dry the rear surface. It is preferred to carry out this gas-blowing step with nitrogen gas.

The water-washing of the rear surface of the wafer and its gas blowing are conducted while the front surface is washed thoroughly with the blowing water. It is preferred to finish the gas-blowing step immediately before the completion of the thorough water-washing step. For this purpose, it may be feasible to start the shower-washing step after the thorough water-washing step has proceeded to a certain extent. By the way, it is not absolutely necessary to conduct the washing of the rear surface of the wafer with a shower of water. It may be achieved by merely pouring water over the rear surface of the wafer. Furthermore, it is preferred to conduct the thorough washing and the water-washing of the rear surface of the wafer with slightly-heated pure water, for example, with pure water of about 30° C. or so. Use of such heated water permits accelerating the washing.

Figure 3:
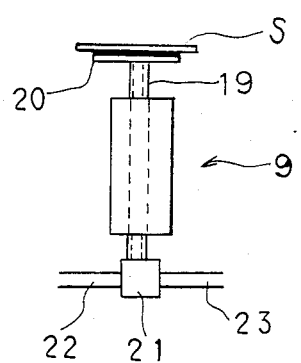
FIG. 3 is a schematic illustration of a spinning machine adapted to carry out the spin-drying step of this invention.

While sucking the rear surface of the thus-dried wafer by means of the sucking disk provided at the front end of the inverting machine 8 and inverting the thus-dried wafer, the wafer is moved to a position above the spinning machine 9 which is rotated by a motor. The spinning machine 9 used in the illustrated system includes, as shown in FIG. 3, a main hollow shaft 19 and a vacuum-sucking disk 20 provided at the top extremity of the shaft 19. The other extremity of the main hollow shaft 19 terminates in a branch pipe with a solenoid valve interposed therebetween. One of the branched pipes, namely, a pipe 22 is communicated to a vacuum source while the other pipe 23 is communicated to a nitrogen gas source. When the sucking disk 30 does not suck any wafer thereon, nitrogen gas is caused to flow out so as to avoid sucking of air. This spinning machine 9 spins while sucking the rear surface of the wafer by means of the sucking disk 20, generally, at a speed of 1000-8000 rpm so that the wafer is spin-dried. Spin-dried wafers are successively placed in another carrier 12 by means of a suitable feeder 24. When a prescribed number of wafers has been received in the carrier 12, they are passed to the next processing step.

Figure 4:
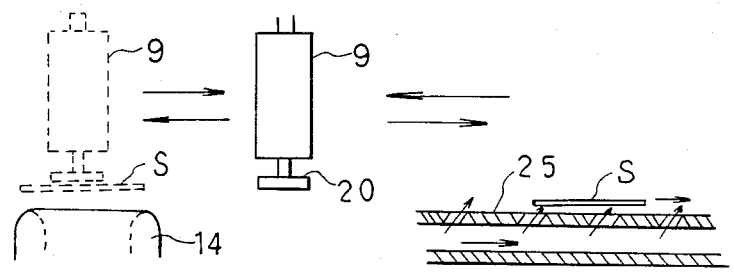
FIG. 4 is a schematic illustration showing another embodiment of the spin-drying step.

By the way, wafers were passed to the spinning machine 9 by the inverting machine 8 in the above-described embodiment. This may be carried out without using the inverting machine 8. For example, the spinning machine 9 may by itself be rendered movable as shown in FIG. 4. The spinning machine 9 may thus be moved to a position above the water-washing tank 14. The spinning machine 9 may then be caused to hold a wafer directly in a sucked state. The wafer is thereafter moved to another position and is spin-dried. The wafer is mounted with its front surface directed downwards for example on an air bearing 25 capable of conveying the wafer by nitrogen gas blown by the air bearing unit 25, so that the wafer can be conveyed to the carrier 12.

In the above embodiment, silicon wafers were referred to. Needless to say, the present invention may be practiced in the same manner with respect to glass photomasks or other semiconductor elements having thin plate-like configurations.

Figure 5:
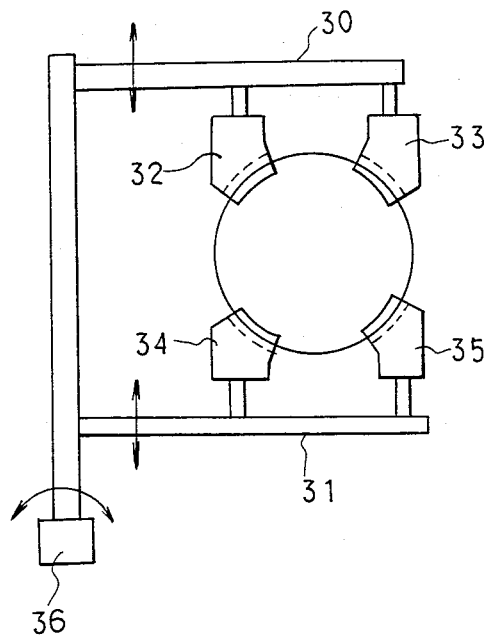
FIG. 5 is a plan view illustrating another embodiment for holding a semiconductor element over a water-washing tank.
Figure 6:
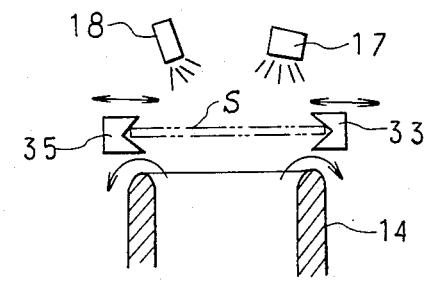
FIG. 6 is a schematic illustration of the water-washing step in the embodiment of FIG. 5.

In the above-described system, the rear surface of each semiconductor element is washed with water in such a state that the semiconductor element is floating over the water-washing tank 14. Alternatively, it is feasible as shown in FIGS. 5 and 6 to transfer the element S from the chuck head 11 by means of gripping portions 32,33,34,35 provided respectively with arms 30,31, which can advance or retreat as desired, after completion of the etching step, to support the element S over the water-washing tank 14, and then to wash both front and rear surfaces of the element S. In FIG. 5, numeral 36 indicates turning means adapted to transfer the thus-washed element S to the next processing step.

Figure 7:
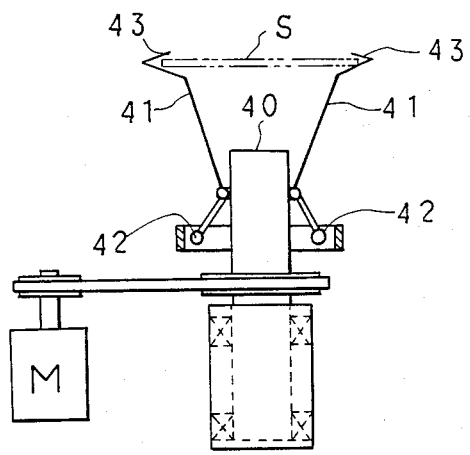
FIG. 7 is a front elevation of another spinning machine.

The spinning of each semiconductor element for its spin-drying may be carried out as illustrated in FIG. 7, namely, by using a spinning machine which comprises a main spindle 40 and a plurality of grippers 41 attached pivotally on the main spindle 40 and formed respectively of wires, the V-shaped holding portions 43 formed respectively at upper end portions of said grippers 41 being shifted inwards when weights 42 provided respectively at lower end portions of said grippers 41 flare outwardly, and then holding the semiconductor element S at the holding portions 43 as depicted in FIG. 7. In this case, it is unnecessary to dry the semiconductor element S by blowing gas thereagainst.

Having now fully described the invention, it will be apparent to one of ordinary skill in the art that many changes and modifications can be made thereto without departing from the spirit or scope of the invention as set forth herein.

What is claimed is:

1. A process for washing and drying a semiconductor element wherein one surface of the element has been subjected to etching, which process comprises:
   (a) holding the semiconductor element horizontally with the etched surface directed downwards over a water-washing tank having essentially vertical side walls and a dished bottom and pre-washing the etched surface of the semiconductor element with water jetted out from water nozzles provided in the tank;
   (b) washing the etched surface with pure water by blowing the pure water upwardly against said etched surface from a port in the bottom of the tank;
   (c) while washing the etched surface with pure water, simultaneously washing the other, upwardly-facing, surface of the semiconductor element by causing water to fall onto the upwardly-facing surface; and then
   (d) spinning the semiconductor element to spin-dry the same.

2. A process as claimed in claim 1, wherein the process comprises a further step of blowing gas against the upwardly-facing surface of the semiconductor element to dry the same after washing the same with water in step (c), and conducting step (d) while holding the semiconductor element by its upwardly-facing surface on a carrier by means of suction.

3. A process as claimed in claim 1, wherein the washing of the upwardly-facing surface of the semiconductor element is conducted by showering water onto the same.

4. A process as claimed in claim 3, wherein the washing of the upwardly-facing surface with the shower of water is carried out after the washing of the etched surface with upwardly-blown water has proceeded to a predetermined extent.

5. A process as claimed in claim 1, wherein the spin-drying step (d) is carried out after turning the semiconductor element upside down by an inverting machine and then mounting the thus-inverted semiconductor element on a spinning machine.

6. A process as claimed in claim 1, wherein the water-washing step (b) of the etched surface is carried out with heated pure water.

* * * * *